US011459656B1

(12) United States Patent
Arkles et al.

(10) Patent No.: US 11,459,656 B1
(45) Date of Patent: Oct. 4, 2022

(54) METHOD AND PRECURSORS FOR PRODUCING OXOSTANNATE RICH FILMS

(71) Applicant: Gelest, Inc., Morrisville, PA (US)

(72) Inventors: Barry C. Arkles, Pipersville, PA (US); Youlin Pan, Langhorne, PA (US); Jonathan D. Goff, Philadelphia, PA (US); Li Yang, Belle Mead, NJ (US)

(73) Assignee: GELEST, INC, Morrisville, PA (US)

( * ) Notice: Subject to any disclaimer, the term of this patent is extended or adjusted under 35 U.S.C. 154(b) by 0 days.

(21) Appl. No.: 17/512,944

(22) Filed: Oct. 28, 2021

Related U.S. Application Data

(60) Provisional application No. 63/243,266, filed on Sep. 13, 2021.

(51) Int. Cl.
C23C 16/455 (2006.01)
G03F 7/11 (2006.01)
(Continued)

(52) U.S. Cl.
CPC ........ C23C 16/45553 (2013.01); C23C 16/56 (2013.01); G03F 7/0043 (2013.01);
(Continued)

(58) Field of Classification Search
CPC . C23C 16/45553; C23C 16/56; G03F 7/0043; G03F 7/11; G03F 7/167; G03F 7/2004
(Continued)

(56) References Cited

U.S. PATENT DOCUMENTS 3,590,060 A 6/1971 Murch
4,696,837 A 9/1987 Lindner
(Continued)

FOREIGN PATENT DOCUMENTS

JP 2020122959 A 8/2020
WO 2017066319 A2 4/2017
(Continued)

OTHER PUBLICATIONS

Cardineau et al., "EUV Resists based on Tin-Oxo Clusters," Proc. of SPIE, Advances in Patterning Materials and Processes XXXI, vol. 9051, pp. 90511B-1-90511B-12 (2014).
(Continued)

Primary Examiner — Lan Vinh
(74) Attorney, Agent, or Firm — Panitch Schwarze Belisario & Nadel LLP

(57) ABSTRACT

A method for forming a fluorinated oxostannate film involves vaporizing a volatile fluorinated alkyltin compound having at least two hydrolytically sensitive functional groups or at least two reactive functional groups which are sensitive to oxidation at a temperature greater than 200° C.; providing a substrate; physisorbing or chemisorbing the fluorinated alkyltin compound onto the substrate; and exposing the physisorbed or chemisorbed fluorinated alkyltin compound to a sequence of hydrolysis, irradiation, and/or oxidation steps to form the fluorinated oxostannate thin film on the substrate. Fluorinated alkyltin compounds having formula (I) are also described, in which $R^f$ is a fluorinated or partially fluorinated linear or branched alkyl group having about 1 to about 5 carbon atoms, X is a dialkylamino group having about 1 to about 4 carbon atoms, and n is 1 or 2:

$$(R^fCH_2)_n SnX_{(4-n)} \qquad (I).$$

13 Claims, 2 Drawing Sheets

Sample A: immersed for 5 min and dried at 120 °C for 5 min

(51) Int. Cl.

| | | |
|---|---|---|
| *C23C 16/56* | (2006.01) | |
| *G03F 7/004* | (2006.01) | |
| *G03F 7/16* | (2006.01) | |
| *G03F 7/20* | (2006.01) | |

(52) U.S. Cl.
CPC ............... *G03F 7/11* (2013.01); *G03F 7/167* (2013.01); *G03F 7/2004* (2013.01)

(58) Field of Classification Search
USPC .......................... 427/255.14, 255.15, 255.17
See application file for complete search history.

(56) References Cited

U.S. PATENT DOCUMENTS

| | | | |
|---|---|---|---|
| 5,698,262 | A | 12/1997 | Soubeyrand et al. |
| 6,861,544 | B1 * | 3/2005 | Curran .................. C07F 7/2208 556/95 |
| 10,732,505 | B1 | 8/2020 | Meyers et al. |
| 10,787,466 | B2 | 9/2020 | Edson et al. |
| 2011/0070371 | A1 | 3/2011 | Gessert et al. |
| 2019/0337969 | A1 | 11/2019 | Odedra et al. |
| 2019/0354010 | A1 * | 11/2019 | Minegishi ............. G03F 7/0043 |
| 2020/0239498 | A1 | 7/2020 | Clark et al. |
| 2020/0241413 | A1 | 7/2020 | Clark et al. |
| 2020/0356000 | A9 | 11/2020 | Minegishi et al. |

FOREIGN PATENT DOCUMENTS

| | | |
|---|---|---|
| WO | 2018139109 A1 | 8/2018 |
| WO | 2019199467 A1 | 10/2019 |
| WO | 2020102085 A1 | 5/2020 |
| WO | 2020264557 A1 | 12/2020 |

OTHER PUBLICATIONS

Eujen et al., "Preparation and Properties of Trifluoromethyl-Substituted Stannanes," J. Organomet. Chem., vol. 434, No. 2, pp. 159-168 (1992) (Abstract Only).

Fallica et al., "Absorption coefficient and exposure kinetics of photoresists at EUV," Proc. of SPIE, vol. 10143, pp. 101430A-1-101430A-11 (2017).

Haitjema et al., "Extreme ultraviolet patterning of tin-oxo cages," Journal of Micro/Nanolithography, MEMS, and MOEMS, vol. 16, No. 3, pp. 033510-1-033510-8 (2017).

Sakai et al., "Progress in metal organic cluster EUV photoresists," J. Vac. Sci. Technol. B, vol. 36, No. 6, pp. 06J504-1-06J504-3 (2018).

Tuyen et al., "Nanomechanical and Material Properties of Fluorine-Doped Tin Oxide Thin Films Prepared by Ultrasonic Spray Pyrolysis: Effects of F-Doping," Materials, vol. 12, No. 10, 1665, pp. 1-12 (2019).

Zhang et al., "The characterization of fluorine doped tin oxide films by Fourier Transformation Infrared spectrum," Materials Letters, vol. 64, pp. 2707-2709 (2010).

International Search Report and Written Opinion dated Jun. 10, 2022 in International Application No. PCT/US2021/056936.

Khrustalev et al., "New stable germylenes, stannylenes, and related compounds. 8. Amidogermanium(II) and—tin(II) chlorides R2N-E14-CI (E14 = Ge, R = Et; E14 = Sn, R = Me) revealing new structural motifs," Applied Organometallic Chemistry, vol. 21, pp. 551-556 (2007).

Molloy, K. C., "Precursors for the formation of tin(IV) oxide and related materials," Journal of Chemical Research, pp. 549-554 (2008).

Stanley et al., "Atmospheric pressure chemical vapour deposition of fluorine-doped tin(IV) oxide from fluoroalkyltin precursors," Applied Organometallic Chemistry, vol. 19, pp. 644-657 (2005).

* cited by examiner

METHOD AND PRECURSORS FOR PRODUCING OXOSTANNATE RICH FILMS

CROSS-REFERENCE TO RELATED APPLICATION

This application claims priority to U.S. provisional patent application No. 63/243,266, filed Sep. 13, 2021, the disclosure of which is herein incorporated by reference in its entirety.

BACKGROUND OF THE INVENTION

Fluorine-doped tin oxide (FTO) thin films are attractive because of properties such as high electronic conduction and optical transparency in the visible region for technological applications, as well as their wide energy gap, low production cost, thermal stability, chemical inertness, and high transparency. Known methods of preparing SnO2 and FTO films include atmospheric pressure chemical vapor deposition (APCVD), sputtering, sol-gel, and spray pyrolysis deposition (SPD). Increasingly, FTO films are desired with dimensional control in terms of thickness, uniformity, and features in the nano-meter range, as well as with low levels of other elemental impurities. Condensed phase deposition methods (sol-gel, spray pyrolysis) do not readily enable ultra-thin films or high purity films due to rheology, viscosity, stress generation and shrinkage during thin film deposition and the inability to provide high elemental purity. While APCVD and sputtering in principle could achieve desirable elemental purities, these methods have specific limitations. For sputtering, conformality with nano-featured substrates is difficult due to the "line of sight" associated with the technology. Limiting issues for APCVD are primarily lack of stability or volatility of suitable precursors. The use of vacuum techniques in CVD allows the utilization of less than volatile precursors than for APCVD, but suitable precursors to date for CVD and APCVD for the deposition of FTO have not been achieved.

Simple trifluoromethyltin compounds including BrSn$(CF_3)_3$, HSn$(CF_3)_3$, H$_2$Sn$(CF_3)_2$, and H$_3$SnCF$_3$ are known in the art but are stable to only −30° C. (see R. Eujen, *J. Orgometal. Chem.*, 434, 159-168 (1992)). Trifluoroethyltin oxide compounds are also known and described in U.S. Patent Application Publication No. 2020/0356000. Monoalkyltriamide tin compounds are described in U.S. Pat. No. 10,787,466, but these compounds do not provide a single source for tin and fluorine.

SUMMARY OF THE INVENTION

In one aspect of the disclosure, provided is a method for forming a fluorinated oxostannate film comprising: vaporizing a volatile fluorinated alkyltin compound having at least two hydrolytically sensitive functional groups or at least two reactive functional groups which are sensitive to oxidation at a temperature greater than 200° C.; providing a substrate; physisorbing or chemisorbing the fluorinated alkyltin compound onto the substrate; and exposing the physisorbed or chemisorbed fluorinated alkyltin compound to a sequence of hydrolysis and irradiation steps followed by oxidation or a second hydrolytic exposure to form the fluorinated oxostannate thin film on the substrate.

In another aspect of the disclosure, provided is a fluorinated alkyltin compound having formula (I):

$$(R^f CH_2)_n SnX_{(4-n)} \quad (I)$$

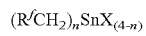

wherein $R^f$ is a fluorinated or partially fluorinated linear or branched alkyl group having about 1 to about 5 carbon atoms, X is a dialkylamino group having about 1 to about 4 carbon atoms, a halogen such as chlorine or bromine, or hydrogen, and n is 1 or 2.

In a further aspect of the disclosure, provided is a two-component deposition mixture comprising: (a) a volatile fluorinated monoalkyltin compound having at least two hydrolytically sensitive functional groups or at least two reactive functional groups which are sensitive to oxidation at a temperature greater than 200° C.; and (b) a fluorinated dialkyltin compound, wherein the fluorinated alkyl groups in the dialkyltin compound are the same as in the monoalkyltin compound.

BRIEF DESCRIPTION OF THE SEVERAL VIEWS OF THE DRAWINGS

The following detailed description of preferred embodiments of the present invention will be better understood when read in conjunction with the appended drawing. For the purposes of illustrating the invention, there are shown in the drawings embodiments which are presently preferred. It is understood, however, that the invention is not limited to the precise arrangements and instrumentalities shown. In the drawings.

DETAILED DESCRIPTION OF THE INVENTION

Figure 1:
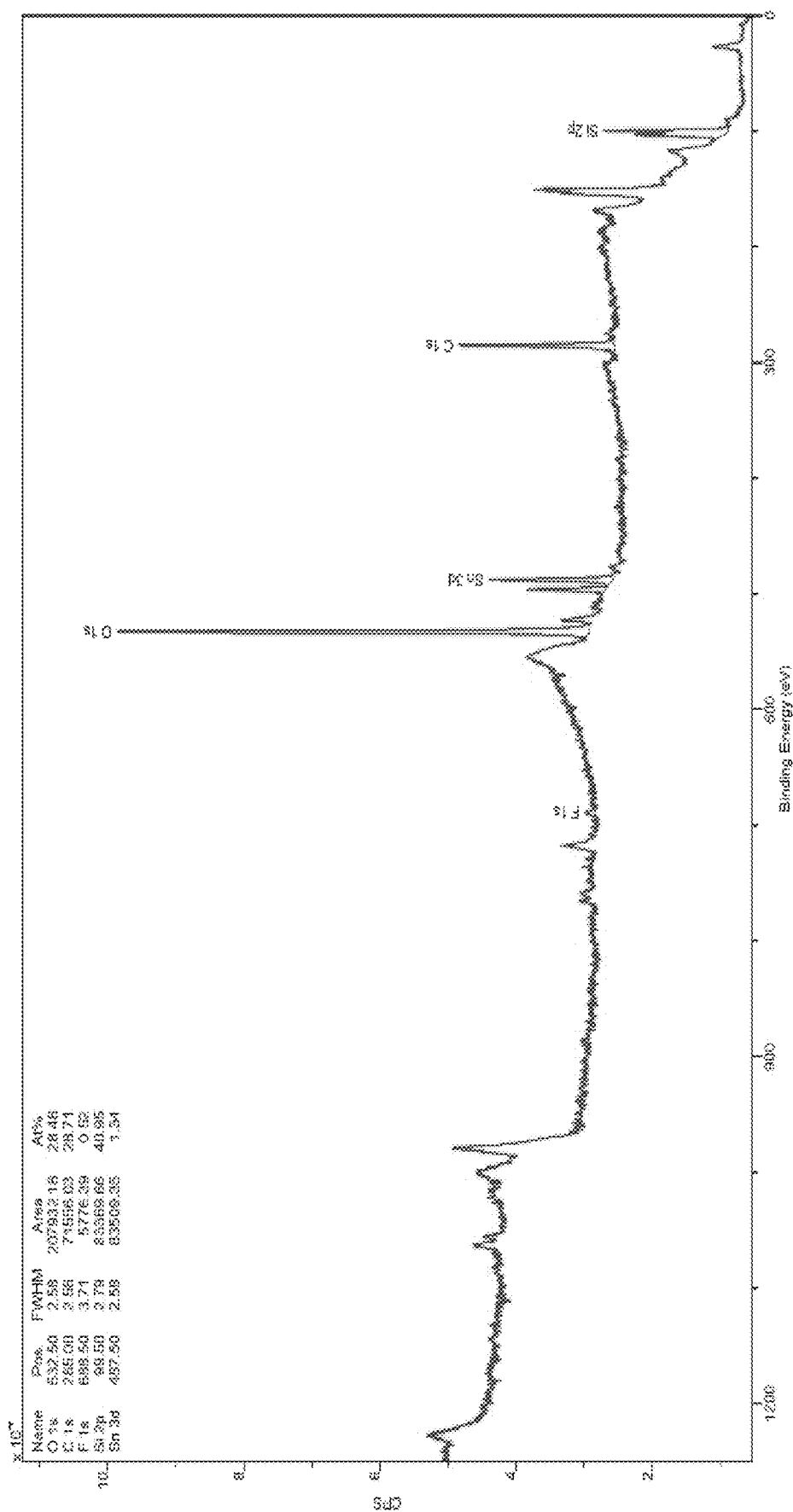
FIG. 1 is an XPS spectrum of a treated silicon wafer according to one embodiment of the disclosure.

This disclosure relates to precursor compounds and compositions containing at least two precursor compounds that can be deposited from the vapor phase to form thin oxostannate rich films. These precursor compositions are sensitive to UV light, EUV light, and/or electron beam radiation and form modified tin oxostannate compositions which have a high optical density and are resistant to shrinkage during conversion to patterned structures or reduced stress-cracking for continuous films. They also can form films with greater than 80% optical transmission in the visual wavelength region with sufficient electrical conductivity to form electrodes. These compositions can also be referred to as fluorine modified oxostannates.

More specifically, embodiments of the disclosure relate to volatile tin organometallic compounds that are stable at room temperature, but which are capable of reacting as a vapor with a solid substrate and, on subsequent exposure to UV radiation (in particular to extreme UV radiation), lose their organic substituents to form an oxostannate film that resists shrinkage by interruption of oxo bridges via the formation of stable tin fluoride bonds.

The fluorinated oxostannate films described herein may alternately be described as SnO:H,F films or fluorine doped tin oxide (FTO) films. The films may be patterned by controlled exposure by rastering with an electron beam or laser or converted in blanket conversion utilizing a suitable lithographic mask to provide optically clear fluorine doped tin oxide conductive films.

Tin Compounds

The volatile tin organometallic compounds are preferably fluorinated alkyltin compounds having formula (I):

$$(R^f CH_2)_n SnX_{(4-n)} \quad (I)$$

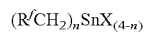

In formula (I), $R^f$ is a fluorinated or partially fluorinated linear or branched alkyl group with about 1 to about 5 carbon atoms, preferably a fluorinated or partially fluorinated ethyl group, and most preferably trifluoroethyl, X is a hydrolytically or oxidatively unstable group, and n is 1 or 2. Each X may be independently, for example and without limitation, a dialkylamino group in which each alkyl group has about 1 to about 4 carbons such as dimethylamino, diethylamino, diisopropylamino, or methylethylamino, a halogen group (such as chlorine or bromine), or hydrogen. In $R^f$, the fluorine atoms may be on any carbon atoms provided that the resulting compound is stable, but are most preferably in the beta or gamma position relative to the tin.

Preferred compounds having formula (I) have formula $R^fCH_2Sn(NMe_2)_3$, as defined above.

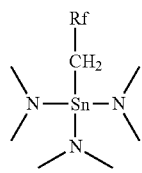

While compounds with more than two fluorinated carbons fall within the scope of this disclosure, environmental and safety concerns at this time make compounds with the minimum number of fluorinated carbon atoms in structural positions where the fluorine atom may be transferred from a carbon atom to a tin atom preferred.

Exemplary fluorinated alkyltin compounds according to aspects of the disclosure include 3,3,3-trifluoropropyltris(dimethylamino)tin; 3,3,3-trifluoropropyltris(diethylamino)tin; 3,3,3-trifluoropropyltris(diisopropylamino)tin; 3,3,3-trifluoropropyltris(methylethylamino)tin; 3,3,3-trifluoropropyltrichlorotin (pictured below); 2,2,2-trifluoroethyltrichlorotin; and 6,6,6,5,5,4,4,3,3-nonafluorobutyltrichlorotin. These compounds are stable, liquid, and volatile.

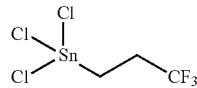

In comparison to simple trifluoromethyltin compounds which are stable to only −30° C. (see, R. Eujen, *J. Orgometal. Chem.*, 434, 159-168 (1992)), the alkyltin compounds according to aspects of the disclosure are stable at storage conditions of 35° C. for extended periods of time. Trifluoroethyltin oxides are taught in U.S. Patent Application Publication No. 2020/0356000 of Minegishi as potential components of condensed phase resinous spin-on films, but no special attributes are contemplated or exemplified.

Monoalkyltin compounds and their oxane derivatives containing two or more carbon atoms and fluorine atoms have been found to readily undergo elimination reactions which remove the organic character from them or their oxostannate derivatives, while at the same time forming tin-fluorine bonds. The tin fluoride bonds are thermally and hydrolytically stable. Films formed containing from 0.1-5 atom % fluorine atoms are less subject to shrinkage than comparable films formed without fluorine. Fluorine has an optical cross-section comparable or greater than oxygen, giving these films desirable properties.

Compositions

In an alternative embodiment, a composition is provided which contains a fluorinated alkyltin compound as described above and 1-10% of a fluorinated alkyltin compound with two similar fluoroalkyl substituents. Provided they are incorporated into the oxostannate film, the inclusion of the second compound can improve the film integrity and cohesion, thus reducing defects. An example of such a compound is bis(3,3,3-trifluoropropyl)dichlorotin. Accordingly, a composition consisting primarily of 3,3,3-trifluoropropyltrichlorotin with 1-10% bis(3,3,3-trifluoropropyl)dichlorotin is suitable for increasing the fluorine content of the FTO film.

Accordingly, the disclosure further relates to a two-component deposition mixture comprising: (a) a volatile fluorinated monoalkyltin compound having at least two hydrolytically sensitive functional groups or at least two reactive functional groups which are sensitive to oxidation at a temperature greater than 200° C.; and (b) a fluorinated dialkyltin compound, wherein the fluorinated alkyl group in the dialkyltin compound is the same as in the monoalkyltin compound.

In preferred embodiments, the fluorinated monoalkyltin compound has formula (II) and the fluorinated dialkyltin compound has formula (III):

$$(R^fCH_2)SnX_3 \qquad (II)$$

$$(R^fCH_2)_2SnX_2 \qquad (III)$$

In formulas (II) and (III), $R^f$ is a fluorinated or partially fluorinated alkyl group as described above and X is a hydrolytically or oxidatively unstable group as described above.

Methods

A method for forming a fluorinated oxostannate film according to aspects of the disclosure comprises: vaporizing a volatile fluorinated alkyltin compound having at least two hydrolytically sensitive functional groups or at least two reactive functional groups which are sensitive to oxidation at a temperature greater than 200° C.; providing a substrate; physisorbing or chemisorbing the fluorinated alkyltin compound onto the substrate; and exposing the physisorbed or chemisorbed fluorinated alkyltin compound to a sequence of hydrolysis and irradiation steps followed by an oxidation or second hydrolytic exposure to form the fluorinated oxostannate thin film on the substrate. Hydrolysis drives the first step of the reaction in which the X group is displaced. This intermediate step forms compositions that may be referred to as organostannasesquioxanes. Concomitant with or subsequent to the irradiation step in which the fluorinated organic group is removed from the Sn atom, the Sn atom (if not substituted by fluorine atom(s)) can be converted to an oxide by interaction with water or oxygen. Not wishing to be bound by theory, after irradiation the $Sn^{+4}$ loses alkyl substitution which can include elimination of an olefin and transfer of a hydrogen or fluorine atom to the tin atom or a homolytic bond cleavage. When the substitution is not fluorine, the tin compound can remain as a tin hydride or it can be reduced to a $Sn^{+2}$ compound. In contrast to other halogens, the Sn—F bond is both hydrolytically and thermally stable, which can be attributed to its relative electronegativity and atomic radius and the ability of tin to form more than four coordinative bonds. Each of these steps will be described in more detail below.

In the first method step, the precursor is vaporized by entrainment in a carrier gas such as nitrogen or argon or by volatization in a vacuum at an appropriate temperature and then transported to the substrate. Any type of substrate known in the art on which it would be desirable to form a film would be appropriate such as, without limitation, a substrate containing one or more metal layers, dielectric materials, semiconductor materials, or combinations thereof, including oxides, nitrides, and polysilicon materials, for example.

Subsequently, the vaporized precursor is physisorbed or chemisorbed onto the substrate using standard techniques associated with CVD, ALD, or similar deposition processes.

Next, the physisorbed or chemisorbed fluorinated alkyltin compound is pulsed with water (preferably as a vapor) to remove the hydrolytically unstable X substituents and replace them with hydroxyl groups (hydrolysis), forming an organostannasesquioxane (organotin oxide hydroxide) coating. In a subsequent step (irradiation), the adsorbed coating is exposed to radiation (preferably EUV) at a wavelength that ruptures the Sn—C bond. Maximum energy levels of irradiation of ~50 mJ/cm$^2$ and more preferably below 10 mJ/cm$^2$ are utilized to avoid damage to the substrate. A portion of the Sn—C bonds are replaced with Sn—F bonds during the irradiation process. Ultimately, all of the Sn—C bonds are replaced with Sn—O or Sn—F bonds. The Sn—O bonds are formed concomitant with or subsequent to irradiation by exposure to oxygen or water. A critical aspect of this invention is that the Sn—F bond is terminating or end-capping in oxostannate structures whereas the divalent oxygen leads to Sn—O—Sn oxane bonds or bridging which cause stress or shrinkage. By reducing the oxane bonds by replacement with F, stress in the films is reduced.

In particular, strong absorption of extreme ultraviolet light associated with tin is observed at 13.5 nm. Most organic moieties bonded to tin have strong absorption of ultraviolet light at 193 nm wavelength and relatively strong absorption up to 230 nm. Accordingly, appropriate wavelengths for the irradiation range from 13.5 to 280 nm, which include EUV and deep UV. At sufficient energy absorption at these wavelengths, the metal-organic bond is cleaved. Simultaneously with or after the cleavage reaction, additional oxo-bridges between the tin atoms are formed either by oxidative, hydrolytic or hydroxyl displacement reactions.

While not wishing to be bound by theory, this process, as well as condensation processes of tin-hydroxyl groups to form stannoxane bonds, is believed to result in denser films which at some levels are desirable, but may also result in shrinkage and distortion which affects the fidelity of the lithographic processes or induces stress-cracking in continuous films. Accordingly, the films prepared by the method described herein achieve the objective of reducing shrinkage of films after radiation exposure. However, other critical performance requirements must be satisfied, including sufficient optical cross-section, film formation on substrate, dose sensitivity (photosensitivity), storage stability (thermal stability), volatile components (off-gassing during exposure or inherent in the compound.) Each of these requirements is described in more detail below.

High Optical Cross Section

A tin-oxo cluster/polymer material has proven to be a promising EUV resist. Notably, the hydroxy-terminated SnOx underlayer on the surface of the substrate material can enhance the absorption of radiation upon the irradiating of the imaging layer and generate secondary electrons from the substrate to further harvest additional EUV photons, making the EUV patterning process more sensitive and reducing the required EUV dose necessary for imaging layer exposure. Among elements of the Periodic Table, tin has a notably high optical cross-section.

Film Formation—Substrate Reactivity.

A metal-organic (RMX$_3$) compound must contain a hydrolyzable ligand-metal bond, where X is the ligand with a hydrolysable M-X bond. In particular, an appropriate organotin compound must be able form a film/polymer/clusters on a wafer surface by CVD, ALD, or spin on. If the application or deposition is in the condensed phase spin-on, the clusters can be formed in a liquid precursor prior to deposition but this typically causes greater shrinkage.

Dose Sensitivity (Photosensitivity)

It is believed that the R group of the precursor plays a key role as UV sensitivity for EUV resist material since films imaging layer of a SnOx thin film that contains or is terminated with alkyl groups is selected such that they will undergo tin-carbon bond cleavage, such as beta-hydride elimination upon irradiation with EUV light. In an EUV patterning step, the alkyl groups can be cleaved, leaving regions of Sn—H bonds while the unexposed surfaces remain alkyl-terminated. The films after exposure to EUV undergo changes, not limited to the loss of organic pendant substituents bonded to metal atoms in low density M-OH rich materials, allowing their crosslinking to denser M-O-M bonded metal oxide materials. The Sn—H bonds, which can be described as tin hydrides, are oxidatively and hydrolytically sensitive and form oxides. The hydrolytic reaction of tin hydrides generates hydrogen, which although a volatile byproduct does not behave as a contaminant.

Storage Stability (Thermal Stability)

Tin compounds have a strong tendency to undergo disproportionation reactions, also referred to as the Kocheshkov comproportionation reaction. Implicit in the performance of the materials is the requirement for moisture reactivity which means moisture sensitivity. Accordingly, the storage stability must be considered while supplying the material and long-term storage as a manufacture.

Volatile Components

While the precursor must have sufficient volatility to be transported to the substrate by vapor deposition methods, components that are volatile and not reactive with the substrate must be minimized since they will diffuse to non-targeted areas. The typical sources of these volatile components result from comproportionation during manufacture or storage and non-comproportionation byproducts formed during radiation exposure.

Additional Aspects of the Disclosure

The disclosure also relates to a method for forming a patterned film which involves preparing the fluorinated oxostannate thin film described herein and exposing the film to non-continuous radiation by means of rastering with an electron beam or laser or lithographic masking.

The disclosure also relates to a method for forming a continuous film comprising preparing the fluorinated oxostannate thin film described herein and exposing the film to blanket exposure utilizing a suitable lithographic mask to provide optically clear fluorine doped oxostannate conductive films.

The invention will now be described in conjunction with the following, non-limiting examples.

Example 1: Synthesis of 3,3,3-Trifluoropropyltriphenyltin

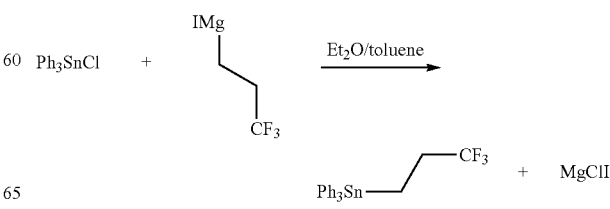

A 3 L round bottom equipped with a pot thermometer, an additional funnel and a mechanical stirrer was charged with 69.4 g (2.85 mol) magnesium chips. 1300 mL diethyl ether and 1 g iodine were added to the flask. A solution of 500 g trifluoropropyl iodide (2.23 mol) in 170 mL diethyl ether was prepared and ca. 10% was charged to the flask. The reaction was stirred until initiation was achieved as observed by visible reflux of ether. The remaining solution of the trifluoropropyl iodide was added dropwise at a rate to maintain reflux of the reaction mixture. After the addition was completed, the reaction was heated to reflux for 2 h. The Grignard was titrated to be 1.20 M.

Another 5 L round bottom flask equipped with a pot thermometer, an additional funnel and a mechanic stir was charged with 674 g (1.75 mol) chlorotriphenyltin and 2400 mL toluene. 1545 ml (1.86 mol) Grignard solution of 1.2 M 3,3,3-trifluoropropymagensium iodide in diethyl ether was added dropwise over 2 h while maintaining the pot temperature below 50° C. After all Grignard solution was added, the reaction was maintained at 40° C. for 4 h and then allowed to cool to room temperature. With stirring, 1400 g of water was added to the reaction mixture. The organic layer was separated and dried over anhydrous sodium sulfate. The organic layer was charged to a 5 L round bottom flask and refluxed with a Dean-Stark trap to remove trace water. The toluene was then removed by distillation to give a pink viscous oil which was used without further purification. The analysis is shown in the following table.

| Structure | $^{119}$Sn Peak (ppm) | $^1$H Peaks (ppm, CDCl$_3$) | Physical Properties |
|---|---|---|---|
| 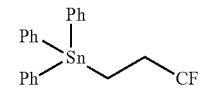 | −98.7 | 1.59 (m, 2H) 2.38 (m, 2H) 7.19 to 7.70 (m, 15H) | Pink viscous oil |

Example 2: Synthesis of 3,3,3-Trifluoropropyltrichlorotin

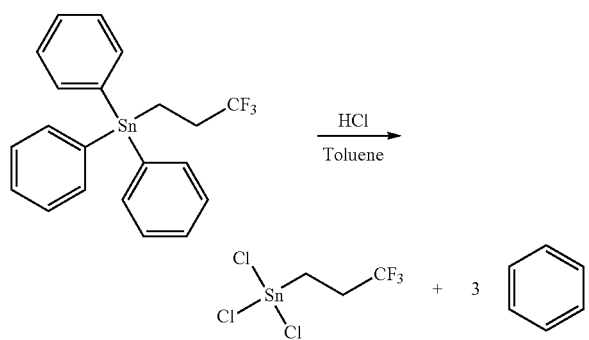

A 5 L round bottom flask equipped with a pot thermometer, an additional funnel and a mechanical stirrer was charged with 447.09 g (1.0 mol) 3,3,3-trifluoropropyltriphenyltin and 600 mL toluene. The reaction was sparged with dry hydrogen chloride gas, resulting in an exothermic reaction. The reaction was kept below 40° C. by addition rate modulation and monitored by $^{119}$Sn NMR. After 16 h of addition, 12 g aluminum chloride was added followed by additional HCl sparging for ~6 h. When the reaction was complete as indicated by NMR, the product was isolated by fractional distillation (60° C. at 3.5 torr) to provide 178 g (55%) of a colorless liquid which was identified as product. After exposure to ambient light the product turned brown. No color change was observed in the dark control.

After one week of heating the product at 35° C., a slight yellow discoloration was observed but no noticeable solids formation. $^{119}$Sn was unchanged and in the $^1$H NMR spectrum the appearance of a small broad singlet around 1.2 ppm was observed. 8 hours of UV illumination revealed some discoloration to a yellow cloudy solution. There was a visible film formed on the walls of the NMR sample tube. Tin NMR appeared unchanged but there were several new broad peaks in the $^1$H NMR spectrum. The properties of the compound are shown in the table below.

| Structure | $^{119}$Sn Peak (ppm) | $^1$H Peaks (ppm, CDCl$_3$) | Physical Properties |
|---|---|---|---|
| 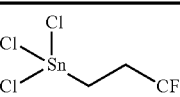 | −3 | 2.348 (t, 2H) 2.659 (tq, 2H) | Colorless to yellow/pink liquid. BP = 68-70° C./6 mmHg Density = 2.11 @25° C. |

Example 3: Synthesis of 3,3,3-Trifluoropropyltris(dimethylamino)tin

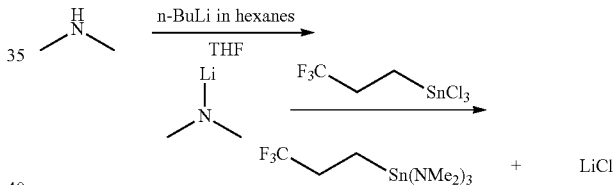

To a 3 L flask equipped with a pot thermometer, an additional funnel and a mechanic stirrer was charged 385.7 (0.91 mol) of a 2.0 M solution of dimethylamine in tetrahydrofuran. 333.3 (0.83 mol) mL of a 2.5 M solution of n-butyllithium in hexanes was added dropwise (with cooling by ice bath) controlling the temperature below 20° C. The resulting slurry was stirred at room temperature for additional 30 minutes. To the lithium dimethylamide slurry was added a solution of 88.6 g (0.28 mol) 3,3,3-trifluoropropytrichlorotin 420 mL tetrahydrofuran while controlling the temperature between −5 to −10° C. The reaction was allowed to stir at room temperature for 6 h. The resulting suspension was filtered twice. The filtrate was then concentrated. The product was isolated as viscous liquid and the structure was confirmed with $^1$H and $^{119}$Sn NMR; properties are summarized in the following table.

| Structure | $^{119}$Sn Peak (ppm) | $^1$H Peaks (ppm, CDCl$_3$) | Physical Properties |
|---|---|---|---|
| 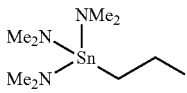 | −41.6 | 1.982 (m, 2H) 2.221 (m, 2H) 2.723 (s, 18H) | Viscous liquid |

Figure 2:
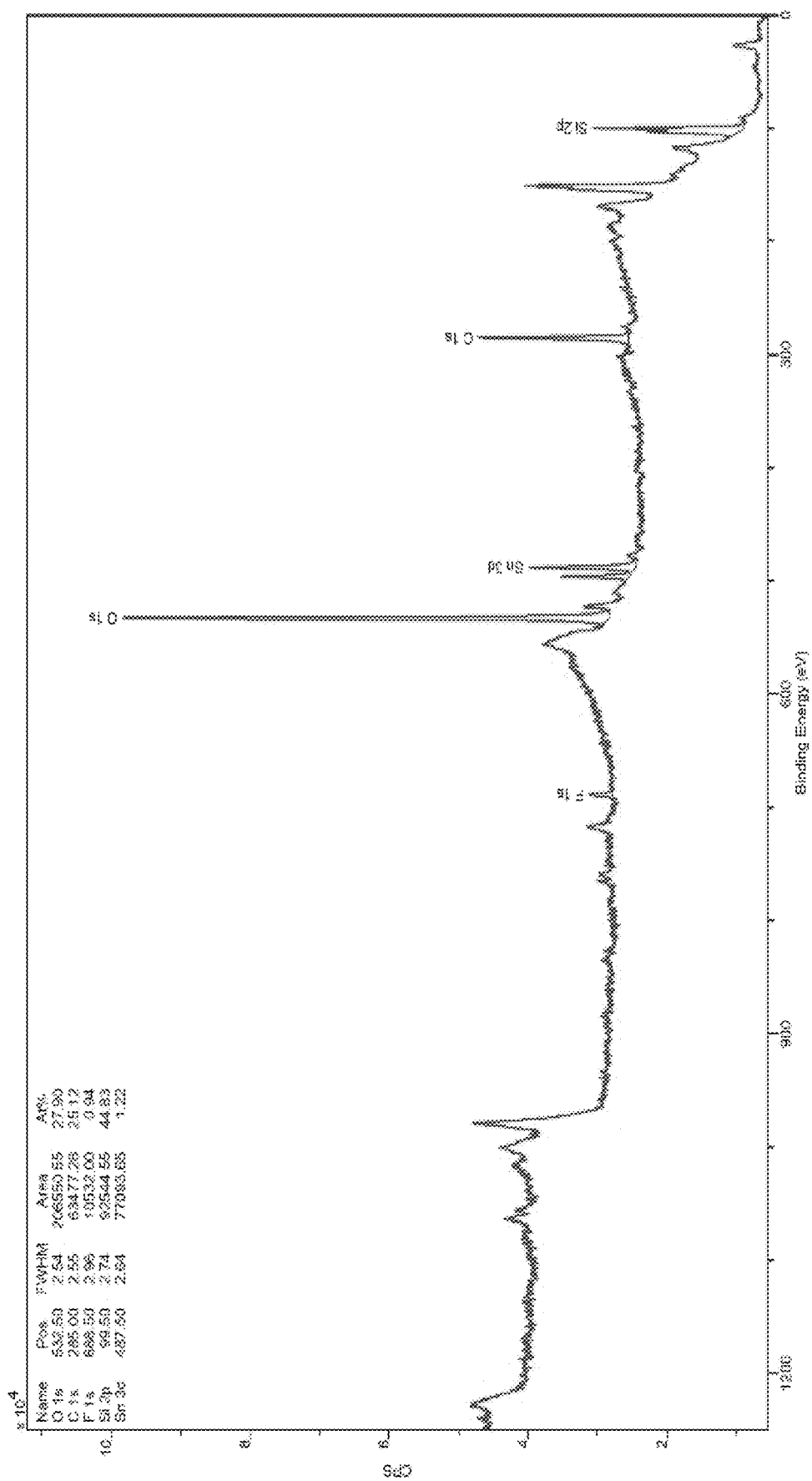
FIG. 2 is an XPS spectrum of a treated silicon wafer according to a second embodiment of the disclosure.

Example 4: Surface Modification of Silicon Wafers with 3,3,3-Trifluoropropyltrichlorotin Silicon wafers were cleaned and dried in the dry box using a hotplate set to 120° C. (or at ambient temperature). 0.2 g of 3,3,3-Trifluoropropyltrichlorotin was dissolved in 16.3 g THF. Two different treatments were applied (samples A and B): immersion for 5 minutes and drying at 120° C. for 5 min (A) and immersion for 5 minutes and drying at room temperature overnight (B). The XPS spectra of the treated surfaces are shown in FIGS. 1 and 2, respectively.

We claim:

1. A method for forming a fluorinated oxostannate film comprising:
    vaporizing a volatile fluorinated alkyltin compound having at least two hydrolytically sensitive functional groups or at least two reactive functional groups which are sensitive to oxidation at a temperature greater than 200° C.;
    providing a substrate;
    physisorbing or chemisorbing the fluorinated alkyltin compound onto the substrate; and
    exposing the physisorbed or chemisorbed fluorinated alkyltin compound to a sequence of hydrolysis and irradiation steps followed by an oxidation or second hydrolytic exposure to form the fluorinated oxostannate thin film on the substrate.

2. The method according to claim 1, wherein the fluorinated alkyltin compound is 3,3,3-trifluoropropyltris(dimethylamino)tin; 3,3,3-trifluoropropyltrichlorotin; 3,3,3-trifluoropropyltriphenyltin; 3,3,3-trifluoropropyltris(diethylamino)tin; 3,3,3-trifluoropropyltris(diisopropylamino)tin; 3,3,3-trifluoropropyltris(methylethylamino)tin; 2,2,2-trifluoroethyltrichlorotin; or 6,6,6,5,5,4,4,3,3-nonafluorobutyltrichlorotin.

3. A method for forming a patterned film comprising preparing the fluorinated oxostannate thin film according to claim 1 and exposing the film to non-continuous radiation by rastering with an electron beam or laser or lithographic masking.

4. A method for forming a continuous film comprising preparing the fluorinated oxostannate thin film according to claim 1 and exposing the film to blanket exposure utilizing a suitable lithographic mask to provide optically clear fluorine doped tin oxide conductive film.

5. The method according to claim 1, wherein the fluorinated alkyltin compound has formula (I):

$$(R^fCH_2)_nSnX_{(4-n)} \qquad (I)$$

wherein $R^f$ is a fluorinated or partially fluorinated linear or branched alkyl group having about 1 to about 6 carbon atoms, X is a hydrolytically or oxidatively unstable group, and n is 1 or 2.

6. The method according to claim 5, wherein $R^f$ is a fluorinated or partially fluorinated ethyl group.

7. The method according to claim 5, wherein each X is independently selected from a dialkylamino group having about 1 to about 4 carbon atoms and a halogen group.

8. The method according to claim 7, wherein X is a dimethylamino group, a diethylamino group, a diisopropylamino group, or a methylethylamino group.

9. The method according to claim 7, wherein X is Cl, Br, or H.

10. A fluorinated alkyltin compound having formula (I):

$$(R^fCH_2)_nSnX_{(4-n)} \qquad (I)$$

wherein $R^f$ is a fluorinated or partially fluorinated linear or branched alkyl group having about 1 to about 5 carbon atoms, X is a dialkylamino group having about 1 to about 4 carbon atoms, and n is 1 or 2, and wherein the compound is 3,3,3-trifluoropropyltris(dimethylamino)tin; 3,3,3-trifluoropropyltris(diethylamino)tin; 3,3,3-trifluoropropyltris(diisopropylamino)tin; or 3,3,3-trifluoropropyltris(methylethylamino)tin.

11. A two-component deposition mixture comprising: (a) a volatile fluorinated monoalkyltin compound having at least two hydrolytically sensitive functional groups or at least two reactive functional groups which are sensitive to oxidation at a temperature greater than 200° C.; and (b) a fluorinated dialkyltin compound, wherein the fluorinated alkyl group in the monoalkyltin compound is the same as the fluorinated alkyl group in the dialkyltin compound.

12. The mixture according to claim 11, wherein the fluorinated monoalkyltin compound has formula (II) and the fluorinated dialkyltin compound has formula (III):

$$(R^fCH_2)SnX_3 \qquad (II)$$

$$(R^fCH_2)_2SnX_2 \qquad (III)$$

wherein $R^f$ is a fluorinated or partially fluorinated linear or branched alkyl group having about 2 to about 6 carbon atoms, and X is a hydrolytically or oxidatively unstable group.

13. A method for forming a fluorinated oxostannate film comprising: vaporizing the mixture according to claim 12;
    providing a substrate;
    physisorbing or chemisorbing the vaporized mixture onto the substrate; and
    exposing the physisorbed or chemisorbed mixture to a sequence of hydrolysis and irradiation steps followed by an oxidation or second hydrolytic exposure to form the fluorinated oxostannate thin film on the substrate.

* * * * *